(12) United States Patent
Guenery et al.

(10) Patent No.: US 12,255,066 B2
(45) Date of Patent: Mar. 18, 2025

(54) METHOD FOR PRODUCING NON-CONTIGUOUS METAL OXIDE SEMICONDUCTORS, OF UNIFORM AND CONTROLLED SIZE AND DENSITY

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin d'Heres (FR); INSTITUT NATIONAL DES SCIENCES APPLIQUEES DE LYON, Villeurbanne (FR); UNIVERSITE CLAUDE BERNARD LYON 1, Villeurbanne (FR); ECOLE CENTRALE DE LYON, Ecully (FR); ECOLE SUPERIEURE CHIMIE PHYSIQUE ELECTRONIQUE LYON, Villeurbanne (FR)

(72) Inventors: Pierre-Vincent Guenery, Saint-Berthevin (FR); Thierry Baron, Saint-Egreve (FR); Jeremy Moeyaert, Grenoble (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin d'Heres (FR); INSTITUT NATIONAL DES SCIENCES APPLIQUEES DE LYON, Villeurbanne (FR); UNIVERSITE CLAUDE BERNARD LYON 1, Villeurbanne (FR); ECOLE CENTRALE DE LYON, Ecully (FR); ECOLE SUPERIEURE CHIMIE PHYSIQUE ELECTRONIQUE LYON, Villeurbanne (FR)

( * ) Notice: Subject to any disclaimer, the term of this patent is extended or adjusted under 35 U.S.C. 154(b) by 151 days.

(21) Appl. No.: 17/780,624

(22) PCT Filed: Nov. 26, 2020

(86) PCT No.: PCT/EP2020/083488
§ 371 (c)(1),
(2) Date: May 27, 2022

(87) PCT Pub. No.: WO2021/105273
PCT Pub. Date: Jun. 3, 2021

(65) Prior Publication Data
US 2023/0360912 A1   Nov. 9, 2023

(30) Foreign Application Priority Data
Nov. 28, 2019   (FR) ...................................... 1913421

(51) Int. Cl.
*C23C 16/18* (2006.01)
*C23C 16/02* (2006.01)
(Continued)

(52) U.S. Cl.
CPC .... *H01L 21/02565* (2013.01); *C23C 16/0281* (2013.01); *C23C 16/407* (2013.01);
(Continued)

(58) Field of Classification Search
CPC ...................................................... C23C 16/18
See application file for complete search history.

(56) References Cited

U.S. PATENT DOCUMENTS

2006/0091499 A1   5/2006   Stecker et al.

FOREIGN PATENT DOCUMENTS

EP   1 426 328 A2   6/2004

OTHER PUBLICATIONS

De Melo, Jr., Ronaldo P. et al., "Urchin-like artificial gallium oxide nanowires grown by a novel MOCVD/CVD-based route for random laser application", *Journal of Applied Physics*, vol. 119, 163107, Apr. 28, 2016, pp. 163107-1-163107-9.
(Continued)

*Primary Examiner* — Austin Murata
(74) *Attorney, Agent, or Firm* — Oblon, McClelland, Maier & Neustadt, L.L.P.

(57) ABSTRACT

A method for producing nanostructures having a metal oxide shell, carried by a top face of a substrate whose greatest
(Continued)

dimension is greater than or equal to 100 mm by MOCVD metalorganic chemical vapour deposition, including successive steps carried out in a reactor configured for MOCVD deposition of nucleation and growth. The nucleation step includes forming non-contiguous metal nuclei by depositing a metal by MOCVD using a metalorganic precursor on the top face of the substrate and oxidising the metal of the metal nuclei, to form oxidised nuclei and ensure stabilisation of the nuclei. The growth step includes depositing a metal by MOCVD using the metalorganic precursor, to form non-contiguous nanostructures by growth of the oxidised nanostructures, and oxidising the deposited metal of the nanostructures formed in the nucleation to form oxidised nanostructures.

18 Claims, 1 Drawing Sheet

(51) Int. Cl.
- C23C 16/40 (2006.01)
- C23C 16/455 (2006.01)
- C23C 16/56 (2006.01)
- H01L 21/02 (2006.01)

(52) U.S. Cl.
CPC ........ *C23C 16/45523* (2013.01); *C23C 16/56* (2013.01); *H01L 21/0262* (2013.01)

(56) References Cited

OTHER PUBLICATIONS

Guenery, P.-V., et al., "Indium Oxide Nanostructure Optimization for RRAM Integration on CMOS BEOL," *2018 IEEE 18th International Conference on Nanotechnology (IEEE-NANO)*, IEEE, Jul. 23, 2018, Jul. 7, 2018, pp. 1-2.

Lohani, J. et al., "Coalesced nanomorphology, in situ, and ex situ applications of self assembled Gallium droplets grown by metal organic chemical vapor deposition," *Chemical Physics A* Materials Science & Processing vol. 493, Jul. 17, 2017, (1 page), pp. 175-182.

Rama, P. Santhana et al., "Formation and growth of embedded indium nanoclusters by $In^{2+}$ implantation in silica," *Applied Physics A*, Materials Science & Processing, vol. 87, 2007, pp. 709-713 (6 total pages).

Wang, Ch. Y. et al., "Photoreduction and oxidation behavior of $In_2O_3$ nanoparticles by metal organic chemical vapor deposition," *Journal of Applied Physics*, vol. 102, 044310, Aug. 27, 2007 (1 page).

International Search Report mailed on Feb. 25, 2021 in PCT/EP2020/083488 filed on Nov. 26, 2020 (citing references AA, AO, and AV-AW therein, 2 pages).

METHOD FOR PRODUCING NON-CONTIGUOUS METAL OXIDE SEMICONDUCTORS, OF UNIFORM AND CONTROLLED SIZE AND DENSITY

TECHNICAL FIELD

The present invention relates to the field of the manufacture of metal oxide nanostructures on a microelectronic substrate by metalorganic precursor chemical vapour deposition (MOCVD). It finds a particularly advantageous application in the field of RRAM (Resistive Random Access Memory) type emerging memories or in chemical sensors. More specifically, the nanostructures obtained with the invention can be used in RRAMs integrated in CMOS (Complementary Metal Oxide Semiconductor) Back End Off Line (end of integration process).

PRIOR ART

The replacement of memory technologies currently used appears to be inevitable in the light of the difficulties encountered in increasing the integration rate thereof. Indeed, the reduction in the size of the basic component of microelectronics, the metal oxide gate field effect transistor known as MOSFET, has reached a critical size with a 10 nm gate. The quantum effects and the substantial current leakages in these small volumes are pitted against greater miniaturisation hence the growing interest in novel technological approaches. For this reason, the field of electronic memories is changing with the appearance of a large number of emerging memories such as resistive random access memory of RRAM. Using a promising principle of controlled variation of the resistive value of a two-terminal component. It is based on a very simple Metal-Insulator-Metal (MIM) type structure. This technology enables comparable performances to MOSFET technology in terms of data retention, but with much higher running speeds, lower energy consumption and an option of easy 3D stacking to increase the integration rate substantially.

This developing technology is currently pitted essentially against a reproducibility problem, as it is based on stochastic phenomena. One of the avenues envisaged to enhance this reproducibility is the addition of nanostructures in the insulator in order to better control the phenomena causing resistive component commutation.

Numerous nanostructure deposition techniques are found in the bibliography, but few are transposable to industry.

It is for example easy to first synthesise the desired nanostructures, disperse them in a solvent before depositing them on a substrate by evaporating the solvent. This technique requires technological steps in liquid phase which are a source of contamination. Furthermore, it is very difficult to obtain a homogeneous deposition, especially on large surfaces such as plates or substrates, commonly known as wafers, of 300 mm used in industry.

Ion implantation is also a nanostructure deposition technique already well-known in industry. It consists of bombarding an oxide with metal ions which form deep clusters. The drawback of the technique is a difficulty controlling the size, density, position and nature of the nanoparticles.

The latest frequently cited technique is chemical vapour deposition (CVD) and more specifically deposition with metalorganic precursors (MOCVD).

The document EP 1426328A2 describes a technique for depositing nanoparticles in steps consisting of a first nucleation step and a second particle growth step enabling a deposition of semiconductor nanostructure, particularly germanium, on a dielectric substrate in two steps.

This method has the drawback of having poor control of the size and density of the particles on the substrate in particular of large size.

Therefore, an aim of the present invention is that of proposing to solve all or some of the drawbacks of known techniques.

The other aims, features and advantages of the present invention will emerge on studying the following description and accompanying drawings. It is understood that other advantages can be incorporated.

SUMMARY

According to an embodiment, a method is provided for producing nanostructures, having a metal oxide shell, carried by a top face of a substrate in which the greatest dimension is greater than or equal to 100 mm by MOCVD metalorganic precursor chemical vapour deposition. The method comprises the following successive steps carried out in a reactor configured for MOCVD deposition:

a. A nucleation step comprising:
  i. a step of forming non-contiguous metal nuclei by depositing a metal by MOCVD by means of a metalorganic precursor on said top face of the substrate, then
  ii. a step of oxidising the metal of the metal nuclei, configured to form oxidised nuclei and intended to ensure stabilisation of the nuclei,
b. At least one growth step comprising:
  i. a step of depositing a metal, preferably at least one metal, by MOCVD by means of the metalorganic precursor, preferably at least one metalorganic precursor, intended to form non-contiguous nanostructures by growth of the oxidised nuclei, then
  ii. a step of oxidising the deposited metal of the nanostructures formed in the preceding step configured to form oxidised nanostructures.

Advantageously, the method comprises an oxidation step after each deposition step so as to stabilise the deposition by allowing the deposited metal, preferably the at least one metal, the time to diffuse to be arranged in a nanostructure and enable it to be oxidised. The metal oxide formed is thus more stable than the metal particularly advantageously having a stability up to a melting point higher than that of the metal. Advantageously, the temperature of the oxidation step is chosen in such a way that the metal is in the liquid state, but the oxide thereof in the solid state. This is particularly possible for all the metals cited hereinafter, with a more or less extensive temperature range according to the metal/oxide pairing.

The stability of the oxidised particles also ensures selectivity of the deposition during the growth step. During the growth step, the metal species obtained by decomposition of the metalorganic precursor will diffuse and be deposited preferably on the nuclei or the nanostructure previously formed rather than on the substrate.

The method according to the invention ensures the formation of non-contiguous nanostructures of homogeneous and controlled size and density.

Optionally, the method can further have at least any one of the following features:

Advantageously, the substrate can be of various types whether dielectric or not.

Preferably, the growth step, comprising the deposition of metalorganic precursor, preferably at least one metalorganic precursor, and the oxidation step, is repeated at least once.

The invention enables the deposition of non-contiguous layers of nanostructures, for example of indium oxide, on large surface areas, for example 300 mm in diameter, with control of the particle size and density with excellent homogeneity. The present invention proposes to only use a single precursor, for example trimethylindium TMIn, and preferably no oxidant species unlike the depositions described in the literature.

Particularly in the document EP1426328, oxidation must be absolutely avoided to enable crystalline growth of Germanium on "single-crystal" Silicon and not on amorphous SiO2. There is no oxidation, Germanium is deposited directly after the step of forming Si nuclei without performing a lengthy stoppage of growth or oxidation step.

Another aspect relates to a substrate in which the greatest dimension is greater than or equal to 100 mm comprising on the top face thereof non-contiguous nanostructures obtained with the preceding method. Advantageously, the non-contiguous nanostructures are at least partially oxidised, preferably fully oxidised. Advantageously, the non-contiguous nanostructures have a size between 1 and 200 nm of which 95% of the nanostructures have a size within plus or minus 20% around the mean value. Advantageously, the non-contiguous nanostructures have a maximum size variation of 2 nm between the centre and the edge of the substrate. Advantageously, the density of the non-contiguous nanostructures is between $10^8$ and $10^{10}$ NCs·cm$^{-2}$. The maximum size of the nanoparticles is dependent on the density, if the density is low, the maximum size that the nanoparticles can reach without being contiguous will be greater than for a greater nanoparticle density.

Another aspect relates to a microelectronic device comprising at least one nanostructure obtained with said method.

BRIEF DESCRIPTION OF THE FIGURES

The aims, subject matter, and features and advantages of the invention will emerge more clearly from the detailed description of an embodiment thereof which is illustrated by the following accompanying drawings wherein.

Figure 1:
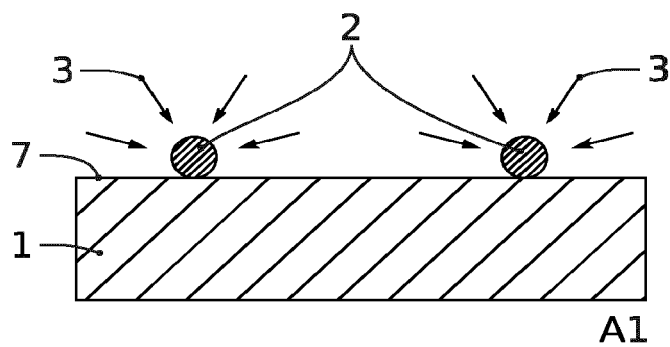
FIG. 1 represents the step of forming the nuclei during the nucleation step.

The drawings are given as examples and are not limiting in respect of the invention. They constitute schematic principle representations intended to facilitate comprehension of the invention and are not necessarily to scale in respect of practical applications. In particular, the layers, nuclei, nanostructures are not representative of reality.

DETAILED DESCRIPTION

Before commencing a detailed review of embodiments of the invention, optional features which can optionally be used in combination or alternatively are listed hereinafter.

Advantageously, the method comprises
c. at least one subsequent further growth step comprising:
  i. a step of depositing a metal, preferably at least one metal, by MOCVD by means of the metalorganic precursor, more preferably the at least one metalorganic precursor from the deposition step of the growth step b)i) intended to grow non-contiguous nanostructures by growth of the oxidised nanostructures, then
  ii. a step of oxidising the deposited metal of the nanostructures in the preceding step configured to form oxidised nanostructures.

Advantageously, the metal of the metal oxide is chosen from indium, gallium, aluminium, tin, antimony, selenium, bismuth, tellurium, zinc, cadmium. Preferably indium, besides its interest for microelectronics, indium oxide is the subject of much research in optics, optoelectronics and photovoltaics for its properties as an electrical conductor and its transparency in the visible range. Interest in the chemical sensor industry will also be noted for its high reactivity with certain species. The method according to the invention is particularly adapted to indium. Indeed, the oxidation step provides a stabilisation of helium, an overly reactive species.

Advantageously, the metalorganic precursor is a gas. The metalorganic precursor/metal pairing being chosen in such a way that the decomposition temperature of the precursor is less than the evaporation temperature of the metal.

Advantageously, if the method comprises several growth steps then the at least one metalorganic precursor is identical at each growth step, more specifically the at least one metalorganic precursor from a subsequent growth step is identical to the at least one metalorganic precursor from the deposition step of the growth step b)i).

Advantageously, the metalorganic precursor chosen for the nucleation step is trimethylindium or trimethylgallium.

Advantageously, the deposition step, preferably of the growth step and of the subsequent growth step, is a deposition of two metals by means of a mixture of two metalorganic precursors.

Advantageously, the at least one metalorganic precursor chosen from the deposition step, preferably of the growth step and of the subsequent growth step, is trimethylindium and/or trimethylgallium.

Advantageously, the metalorganic precursor is the same during all the steps of the method.

Advantageously, in the nucleation step and/or in the growth step, the step of depositing metal by means of the metalorganic precursor has a duration of less than 30 seconds, preferably 15 seconds. The deposition step during the nucleation step is advantageously a pulse of metal precursor. A pulse is a supply of metal precursor for a short time. This step must be controlled, as it makes it possible to define the density of the nanostructures on the substrate.

Advantageously, in the nucleation step and/or in the growth step, the defined time of the oxidation step has a duration greater than the duration of the step of depositing the metal precursor, preferably at least 45 seconds, or preferably at least 60 seconds. The oxidation step can be considered as a rest or stabilisation step. The duration is advantageously sufficient to ensure total oxidation of the metal deposition performed in the preceding deposition step.

Advantageously, in the nucleation step and/or in the growth step, the oxidation step is carried out without injecting oxidant precursor into the reactor. Advantageously, the oxidation occurs by capturing oxygens present in the environment of the deposited metal, such as for example in the ambient oxygen or the oxygen of the substrate.

Advantageously, the quantity of metalorganic precursor injected into the reactor during the deposition step of the nucleation step is less than 50 μmol/min.

Advantageously, the quantity of metalorganic precursor injected into the reactor during the deposition step of the growth step is less than 50 µmol/min.

Advantageously, in the nucleation step and/or in the growth step, the oxidation step is carried out at an identical temperature to a temperature of the nucleation step. Preferably, the temperature of the oxidation step is chosen in such a way that the metal is in the liquid state, but the oxide thereof in the solid state.

Advantageously, the oxidised nanostructures are partially oxidised. Preferably, the oxidised nanostructures are fully oxidised. Advantageously, the nanostructures are composed of the metal oxide shell. Advantageously, the nanostructure is entirely composed of metal oxide.

Advantageously, the top face of the substrate is a layer of an electrically conductive material.

Advantageously, the substrate advantageously has a diameter of 300 mm.

The invention also relates to a microelectronic device comprising at least one nanostructure obtained with the method as described above. Integrating nanoparticles for example of indium oxide in the oxide of resistive memories by MOCVD enables a reduction in resistive commutation variability thanks to this single technological step.

It is specified that within the scope of the present invention, the terms "one", "tops", "covers" or "underlying" or the equivalents thereof do not means "in contact with". For example, depositing a first layer on a second layer does not necessarily mean that the two layers are directly in contact with one another, but this means that the first layer at least partially covers the second layer either by being directly in contact therewith or being separated therefrom by at least one other layer or at least one other element.

Thickness

The thickness is measured along a direction perpendicular to the main faces of the substrate whereon the different layers rest. If the substrate has faces forming disks, then the thickness thereof is measured perpendicularly to these faces. In the figures, the thickness is measured along the vertical.

Similarly, when it is indicated that an element is located in line with another element, this means that these two elements are both on the same line perpendicular to the principal plane of the substrate, i.e. on the same vertically oriented line in the figures.

Width

The width is measured along a direction parallel with the main faces of the substrate whereon the different layers rest. In the figures, the width is measured along the horizontal direction.

The method according to the invention is intended to form nanostructures. The nanostructures obtained with the present method are non-contiguous. The nanostructures 6 are formed on the surface of a substrate 1. They are supported by a face 7 of the substrate 1. The nanostructures 6 are non-contiguous, i.e. they do not touch. The nanostructures are separated from one another. Preferably, the minimum gap between the nanostructures is 50 nm. Advantageously, all the nanostructures 6 formed are supported by a face 7 of the substrate 1. Preferably, the nanostructures form a non-contiguous layer.

According to an embodiment, the nanostructures obtained with the method according to the invention comprise a metal oxide shell. The nanostructure comprises either an at least partially metal core encapsulated in an oxide shell, or the nanostructure is composed on the metal oxide shell, i.e. the nanostructure 6 is entirely made of metal oxide.

Advantageously, the nanostructures are of homogeneous size and advantageously of homogeneous density on the surface of the substrate. Preferably, the size of the nanostructures is homogeneous with a maximum size variation of 2 nm between the edge of the substrate and the centre. Preferably, the nanostructures formed have a size between 1 and over 100 nm in height. Advantageously, the nanostructures are nanoparticles. Preferably, the nanoparticles have a hemispherical shape. The density of the nanostructures on the surface of the substrate is between $10^8$ NCs·cm$^{-2}$ and $10^{10}$ NCs·cm$^{-2}$ (nanoparticles per cm$^2$).

The method is performed on a substrate advantageously adapted to the microelectronic method. The substrate is commonly known as a wafer. Preferably, the method according to the invention is particularly adapted to substrates of industrial size. Preferably, the greatest dimension of the substrate is greater than or equal to 100 mm. Preferably, the industrial substrates are of circular shape, the greatest dimension whereof being the diameter. A large-sized substrate is understood as a substrate of diameter greater than or equal to 100 mm and preferably at least 300 mm.

The substrate according to the invention can be of all types. Advantageously, the substrate has an affinity with the metalorganic precursor used in said method for ensuring the deposition thereof on the surface of the substrate. Affinity is defined advantageously in the present invention as the wettability of the metalorganic precursor on the substrate. The wettability being the ability of a material to spread on another. The substrate is configured to accept the formation of the nanostructures.

The substrate can be a dielectric or non-dielectric, monocrystalline or not. By way of preferred example, the substrate is chosen from silicon dioxide ($SiO_2$), silicon nitride ($Si_3N_4$), or silicon (Si) or aluminium oxide or hafnium oxide.

The method is carried out using MOCVD or MetalOrganic Chemical Vapour Deposition. MOCVD is a crystalline growth technique wherein the elements to be deposited, in metalorganic form, are carried by the substrate by a carrier gas 3. The substrate 1 is heated and scavenged by a carrier gas 3. The carrier gas 3 is used to convey the metal to be deposited onto the substrate 1. The metal is in metalorganic precursor form. If the conditions are well chosen, the precursor pyrolyses in contact with the heated substrate 1, the sought metal is deposited on the substrate 1, and the precursor residue is removed by the carrier gas 3. The method is carried out inside a reactor, more specifically a chamber of a reactor. Preferably, the reactor is laminar flow.

According to the invention, the method comprises at least two steps. A first step referred to as nucleation step and then at least one growth step.

The nucleation step is intended to form the nuclei on the surface of the substrate. The nucleation step is configured to control nanostructure density on the substrate.

Advantageously, the nucleation step comprises two steps.

The nucleation step preferably starts with a deposition step (A1) of a metalorganic precursor on the substrate, also known as formation step. More specifically on a top face 7 of the substrate 1. The deposition step comprises the deposition of a small quantity of metal, advantageously by a pulse of the metal precursor. The term pulse denotes that the time for the carrier gas 3 to carry the metalorganic precursor to the surface of the substrate is short. The deposition of a small quantity of metal is controlled particularly by the deposition time and the metalorganic precursor flow. The quantity of metal to deposit to obtain non-contiguous nuclei 2 is advantageously less than the quantity of metal for a monolayer. To determine this, a person skilled in the art knowing the growth rate of the material in its reactor, the decomposition rate of the precursor and the size of the substrate will thus adapt the volume of precursor introduced. By way of preferred example, the quantity of precursor injected is between 2 and 40 µmol/min.

According to a preferred embodiment, the duration of the deposition step during the nucleation step is less than 1 minute, preferably less than 30 s and more preferably of the order of 15 seconds.

The quantity of metalorganic precursor decomposed during this deposition step controls the density of deposited nuclei.

The carrier gas flow is preferably a constant flow, at least during the deposition step of the nucleation step. According to one option, the flow varies between 10 slm and 40 slm. The gas can be dihydrogen, dinitrogen, argon or helium. By way of example, the carrier gas is dihydrogen for example at 10 slm (Standard Litre per Minute).

This deposition step of the nucleation step can be carried out in a wide temperature range from the decomposition temperature of the precursor to the desorption temperature of the species of the surface of the substrate. The maximum temperature is chosen so that the competition between the deposition of the metalorganic precursor and desorption of the metal species of the surface is in favour of deposition.

The metalorganic precursor is advantageously supplied by a carrier gas. The metalorganic precursor is chosen according to the metal that it is sought to deposit on the substrate. By way of example, the metalorganic precursor is chosen from trimethylindium (TMIn) or trimethylgallium (TMGa).

The deposited metal is chosen from indium, gallium, zinc, cadmium, aluminium, tin, antimony, bismuth, tellurium, selenium. The metal and the deposition temperature are chosen such that the metal is in the liquid state and that the oxide thereof is in the solid state at the deposition temperature.

Following the deposition step, the nucleation step comprises an oxidation step (A2). The deposition step and the oxidation step are advantageously successive, i.e. sequential and separate. When the deposition step (A1) is complete, then the oxidation step (A2) can take place.

The oxidation step (A2) stabilises the nuclei 2 formed during the preceding deposition step (1). Stabilisation makes it possible to allow the deposited metal to be arranged in nanostructures. This step makes it possible to oxidise the metal by allowing it the possibility to pump oxygen into the environment thereof. The oxidised nuclei have a greater stability. Indeed, the oxidised nuclei 4 act as traps for the metal species subsequently injected.

The oxidation step (A2) is defined as a time during which the supply of metalorganic precursor is stopped. It is a stabilisation step.

The oxidation step (A2) of the nucleation step is advantageously carried out at a temperature less than the evaporation temperature of the metal, preferably, the temperature of the oxidation step of the nucleation step is identical to that of the deposition step of the nucleation step.

According to a preferred embodiment of the invention, the oxidation step (A2) is carried out without supplying oxidant precursor particularly in the reactor. This means that the method does not comprise injecting an oxidant precursor into the reactor. Oxidation is performed by the oxygen present in the environment of the deposited metal, the oxygen is obtained either from the substrate which can be oxidised, or from the residual oxygen present in the atmosphere of the reactor, even when the step is carried out in an inert atmosphere. Advantageously, the oxidation step (A2) is a rest step. The oxidation step is preferably longer than the deposition step of the nucleation step. By way of example, the oxidation step lasts more than 45 seconds, preferably more than 60 seconds.

According to another embodiment, oxidant precursor can be supplied in the reactor during this oxidation step. The oxidant precursor can be chosen from dioxygen ($O_2$), or dihydrogen oxide ($H_2O$). The oxidant precursor is introduced into the reactor in gas form.

According to the embodiment without a supply of oxidant precursor, the advantage is that of not intentionally introducing oxygen into the reactor and preventing the oxidation of other materials present on the substrate. On the other hand, the intentional introduction of oxidant precursor could make it possible to increase the oxidation rate and therefore reduce the time of the oxidation step and also fully oxidise the metal particles.

The oxidised nuclei 4 obtained following the nucleation step (A1 and A2) are very small in size compared to the size of the nanostructures obtained following the method. By way of example, the nuclei are formed at most from a few dozen atoms, for example, a 5 nm diameter Indium nucleus contains 20 Indium atoms.

According to the invention, the method comprises a second step following the nucleation step. The second step of the method is the step of growing the nuclei. The growth step follows the oxidation step (A2) of the nucleation step. The nucleation step and the growth step are advantageously successive, i.e. sequential and separate. When the nucleation step is complete, then the growth step can take place. More specifically, when the oxidation step (A2) of the nucleation step is complete, then the growth step can start.

The step of growing the nuclei is intended to grow the nuclei to reach the desired nanostructure size. The growth step advantageously comprises two steps.

The first step of the growth step is a deposition step (B1) of the metal obtained by decomposing at least one metalorganic precursor intended to grow the nuclei 4 formed during the nucleation step.

According to a first option, this deposition step (B1) is carried out with a metalorganic precursor advantageously identical to the metalorganic precursor of the nucleation step. Advantageously, the method according to the invention is carried out with a single type of metalorganic precursor.

According to another option, this deposition step (B1) of the growth step is carried out with a different metalorganic precursor from the metalorganic precursor used for the formation step of the nucleation step.

According to another option, this deposition step (B1) of the growth step is carried out with a mixture of metalorganic precursors. The mixture of metalorganic precursors comprising at least two, preferably two, metalorganic precursors. The mixture of metalorganic precursors can comprise the metalorganic precursor used in the deposition step of the nucleation step or comprise different metalorganic precursors from the metalorganic precursors used in the formation step of the nucleation step. The use of a mixture of metalorganic precursors in the deposition step of the growth step results in the formation of an alloy. In the case where the growth step is carried out with more than one metalorganic precursor, i.e. two different metalorganic precursors then an alloy is formed. By way of example, an indium-gallium alloy is formed by using two different metalorganic precursors in the deposition step of the growth step: trimethylindium (TMIn) and trimethylgallium (TMGa).

According to an embodiment, the metalorganic precursor(s) is (are) advantageously supplied by a carrier gas. The metalorganic precursor(s) is (are) chosen according to the metal that it is sought to deposit on the substrate. By way of example, the at least one metalorganic precursor is chosen from trimethylindium (TMIn) and/or trimethylgallium (TMGa).

The deposition step comprises the deposition of a small quantity of metal advantageously by a pulse of metalorganic precursor. This arrangement helps promote the deposition of metal on the nuclei rather than on the surface of the substrate. The growth of the nuclei is promoted over the germination of nuclei. The homogeneity in size and density of the nuclei on the substrate surface is maintained and controlled. The term pulse denotes that the time for the carrier gas to carry the metalorganic precursor to the surface of the substrate is short. The deposition of a small quantity of metal is controlled by the deposition time and the precursor flow. The quantity of metal to deposit to obtain non-contiguous nanostructures is advantageously less than the quantity of metal for a monolayer. To determine this, a person skilled in the art knowing the growth rate of the material in its reactor, the decomposition rate of the precursor and the size of the substrate will thus adapt the volume of precursor introduced.

According to a preferred embodiment, the duration of the deposition step during the growth step is less than 1 minute, preferably less than 30 s and more preferably of the order of 15 seconds.

The quantity of metalorganic precursor decomposed during this deposition step controls the size of the forming nanostructure.

The carrier gas flow is preferably a constant flow, at least during the deposition step of the growth step. According to one option, the flow varies between 10 slm and 40 slm. The gas can be dihydrogen, dinitrogen, argon or helium. By way of example, the carrier gas is dihydrogen for example at 10 slm (Standard Litre per Minute).

This deposition step (B1) of the growth step can be carried out in a wide temperature range from the decomposition temperature of the metalorganic precursor to the desorption temperature of the metal species of the surface of the substrate. The maximum temperature is chosen so that the competition between the deposition of precursor and desorption of the species of the surface is in favour of deposition. Advantageously, the temperature is identical to that chosen for the nucleation step and more specifically the deposition step (A1) of the nucleation step which limits parameter modifications and facilitates the method without requiring energy for increasing and lowering the temperature.

The deposition step (B1) of the growth step is advantageously identical for the deposition step (A1) of the nucleation step in particular in parameter selection. The difference lies in the selectivity of the deposition on the nuclei already formed 4 rather than on the surface 7 of the substrate 1. Advantageously, the deposition temperature is between the melting point of the metal and that of the oxide thus contributing to the selectivity of the deposition. Thus, the atoms contained in the oxidised nanostructures (therefore in the solid state) can no longer diffuse to the surface of the substrate and act as traps for the new metal atoms introduced.

Following the deposition step (B1), the growth step comprises an oxidation step (B2). The deposition step (B1) and the oxidation step (B2) are advantageously successive, i.e. sequential and separate. When the deposition step (B1) is complete, then the oxidation step (B2) can take place.

The oxidation step (B2) stabilises the metal deposition carried out during the preceding deposition step (B1). Stabilisation makes it possible to allow the deposited metal to be arranged in solid nanostructures. This step makes it possible to oxidise the metal by allowing it the possibility to pump oxygen into the environment thereof. The oxidised metal has a greater stability. Indeed, the metal is stable as long as the melting point of the metal has not been reached while the oxidised metal is stable as long as the melting point of the metal oxide has not been reached, but the melting point of the metal oxide is greater than that of the metal providing greater stability.

The oxidation step (B2) is defined as a time during which the supply of metalorganic precursor is stopped. It is a stabilisation step.

The oxidation step of the growth step is advantageously carried out at a temperature less than the evaporation temperature of the metal, and at a temperature less than the melting point of the oxide, preferably, the temperature of the oxidation step of the growth step is identical to that of the deposition step of the growth step.

According to a preferred embodiment of the invention, the oxidation step (B2) is carried out without supplying oxidant precursor particularly in the reactor. Oxidation is performed by the oxygen present in the environment of the deposited metal, the oxygen seems to be obtained either from the substrate which can be oxidised, or from the residual oxygen present in the atmosphere of the reactor, even when the step is carried out in an inert atmosphere. Advantageously, the oxidation step is a rest step. The oxidation step is preferably longer than the deposition step of the growth step. By way of example, the oxidation step lasts more than 45 seconds, preferably more than 60 seconds.

According to another embodiment, oxidant precursor can be supplied in the reactor during this oxidation step. The oxidant precursor can be chosen from dioxygen ($O_2$), or dihydrogen oxide ($H_2O$). The oxidant precursor is introduced into the reactor in gas form.

According to the invention, the growth step (B1 and B2) can be repeated. The cycle of the deposition step (B1) following by the oxidation step (B2), of the growth step can be repeated several times. According to one option, the growth step is repeated at least once, i.e. the method comprises two successive growth steps. The number of repetitions of the growth step influences the quantity of metal deposited and therefore the sought nanostructure size.

According to an embodiment, the nanostructure comprises an oxidised metal shell and an at least partially metal core. To achieve this partially oxidised structure with a core-shell form, a deposition step of the growth step of longer duration and/or with a substantial precursor supply can be provided. This enables rapid growth of the nuclei. As the deposition of deposited metal is substantial, the oxidation step of the growth step can be insufficient to oxidise all the metal deposited.

Preferably, the nanostructure is composed of the oxidised metal shell 6. The nanostructure is fully oxidised 6. To obtain this structure, the method according to the invention is particularly useful, the successive growth steps ensuring full oxidation of the nanostructure.

The figures attached illustrate the two steps of the method according to the invention.

FIG. 1 illustrates the deposition step of the nucleation step, referred to as A1. The metalorganic precursor is injected into the chamber with the carrier gas 3 so as to scavenge the surface of the face 7 of the substrate 1. Non-contiguous metal nuclei 2 are formed on the surface of the face 7 of the substrate 1. The nanostructures are of homogeneous and controlled size and density.

Figure 2:
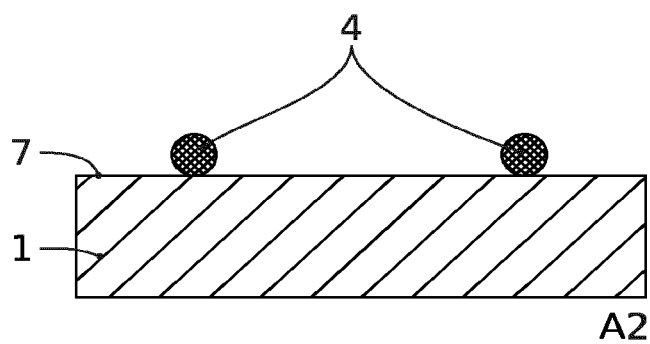
FIG. 2 represents the step of oxidising the nuclei during the nucleation step.

FIG. 2 illustrates the oxidation step of the nucleation step, referred to as A2. The flow of carrier gas and of metalorganic precursor is advantageously stopped. The metal of the nuclei 2 is oxidised, forming metal oxide nuclei 4.

Figure 3:
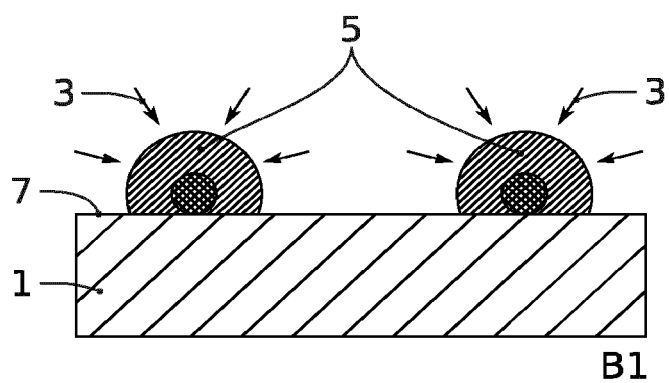
FIG. 3 represents the step of growing the nuclei on a substrate during the growth step.

FIG. 3 illustrates the deposition step of the growth step, referred to as B1. The metalorganic precursor is injected into the chamber with the carrier gas 3 so as to scavenge the surface of the face 7 of the substrate 1. The metal is advantageously deposited selectively on the oxidised metal nuclei 4 rather than on the surface of the face 7 of the substrate 1. The nanostructures 5 have an oxidised metal core covered with metal.

Figure 4:
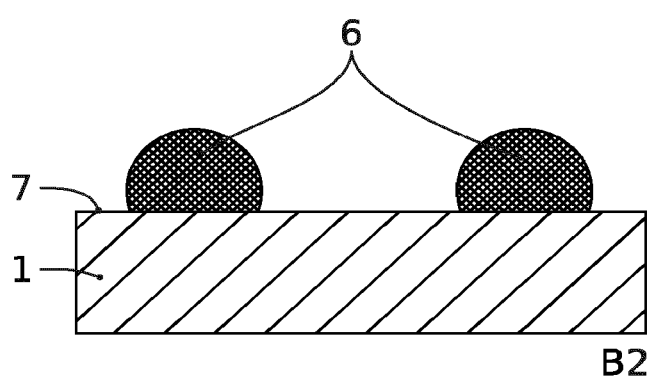
FIG. 4 represents the step of oxidising the nanostructures during the growth step.

FIG. 4 illustrates the oxidation step of the growth step, referred to as B2. The flow of carrier gas and of metalorganic precursor is advantageously stopped. The metal of the nanostructures 5 is oxidised, forming metal oxide nanostructures 6. The nanostructures are of homogeneous and controlled size and density. The nanostructures are non-contiguous and of hemispherical shape.

According to an embodiment, steps B1 and B2 can be repeated in cycles after steps A1 and A2 so as to control the size of the nanostructures produced.

EXAMPLE

An example of a method according to the invention is described for obtaining a homogeneous and non-contiguous layer of nanoparticles of average height 11 nm with a density of $2.10^{10}$ NCs·cm$^{-2}$ on silicon oxide.

The method for producing nanostructures is carried out by depositing indium oxide nanoparticles by means of metalorganic precursor chemical vapour deposition (MOCVD) on a 300 mm diameter monocrystalline silicon wafer previously thermally oxidised to obtain a 5 nm thermal oxide layer. The MOCVD reactor used is laminar-flow.

The method starts with the nucleation step. Pure indium is deposited by decomposing the metalorganic precursor, trimethylindium (TMIn), at 420° C. and at a pressure inside the reactor of 80 Torr, or 10.7 KPa. This deposition is performed in an inert atmosphere with a constant dihydrogen flow of 10 slm. This temperature and the gas flow are maintained throughout the method, i.e. from the insertion of the wafer into the reactor to its removal.

The first deposition step of the nucleation step aims to control firstly the nucleation of the first indium oxide seeds by adjusting the quantity of indium inserted into the reactor. For this example, the step consists of a pulse of precursor TMIn of 5 s with a flow of 40 µmol/min. The partial pressure of the precursor is 401.2 Pa and the quantity of metalorganic precursor injected into the reactor chamber is 3.3 µmol. The pulse time, the temperature in the reactor, the precursor flow and that of the carrier gas are parameters to be taken into account, as they determine the quantity of metalorganic precursor that will be decomposed. By extension, they are directly linked with the quantity of indium reacting to form seeds. In other words, these parameters control the density of nuclei to be formed during this step which is equal to the final particle density. It should also be noted that these parameters can play an important role in the decomposition profile of the precursor in the chamber. If this profile is poorly controlled, it would impact the homogeneity of the deposition. They should be adapted according to the geometry of each CVD deposition reactor in particular.

To ensure that indium, which is highly reactive at this pressure/temperature pairing, has the time to diffuse and be oxidised by pumping oxygen into the silicon oxide, the second step consists of an oxidation step. This step is a 60 s stabilisation at the temperature of 420° C. This step ensures the oxidation of all the nuclei to indium oxide. This stabilisation makes it possible to prevent excess precursors forming new nuclei which would induce a nanoparticle size gradient and a loss of homogeneity. With the deposition conditions described above, a nuclei density of $2.10^{10}$ cm$^{-2}$ is achieved with heights measured with an atomic force microscope (AFM) of 4 nm on average.

The second step of the method corresponds to at least one growth step. The growth step comprising a deposition step and an oxidation can be repeated. Deposition-oxidation cycles can then be carried out. The growth step can therefore be cycles of pulses and stabilisation of the deposited indium. In the case of the example, a single deposition/oxidation (stabilisation) cycle is sufficient to achieve the sought nanoparticle size. This growth step is conducted in the same way as the first nucleation step: a deposition step with a 5 s pulse of TMIn with a 40 µmol/min flow followed by stabilisation with a 60 s oxidation step at 420° C. This growth step makes it possible to grow the nanoparticles to achieve sizes of 11 nm on average without seeding new particles.

The wafer characterisation shows a deposition of nanoparticles of average size 11 nm with a density of $2.10^{10}$ cm$^{-2}$ on the entire surface. The nanoparticle dispersion is low with 95% of the particles between 8 and 14 nm and an average of 11.5 nm and a standard deviation of 1.7 nm. The homogeneity is also very good with an average particle size variation of 2 nm between the edge of the wafer and its centre (i.e. a deviation of 15 cm).

The invention is not limited to the embodiments described above and extends to all the embodiments covered by the claims.

REFERENCE LIST

1. Substrate
2. Nuclei
3. Precursor gas
4. Oxidised nuclei
5. Nanostructure
6. Oxidised nanostructure
7. Face of substrate

The invention claimed is:

1. A method for producing nanostructures having a metal oxide shell, carried by a top face of a substrate in which a greatest dimension is greater than or equal to 100 mm by MOCVD metalorganic chemical vapour depositions, wherein the method comprises the following successive steps carried out in a reactor configured for MOCVD deposition:
 a) a nucleation step comprising:
  i) a step of forming non-contiguous metal nuclei by depositing a metal by MOCVD using a metalorganic precursor on said top face of the substrate, then
  ii) a step of oxidising the metal of the metal nuclei, configured to form stabilized oxidised nuclei, and
 b) at least one growth step comprising:
  i) a step of depositing a metal by MOCVD using the metalorganic precursor to form non-contiguous nanostructures by growth of the oxidised nuclei, then ii) a step of oxidising the deposited metal of the nanostructures formed in the preceding step to form oxidised nanostructures.

2. The method according to claim 1 comprising
c. at least one subsequent further growth step comprising:
   i. a step of depositing a metal by MOCVD using the metalorganic precursor to grow non-contiguous nanostructures by growth of the oxidised nanostructures, then
   ii. a step of oxidising the deposited metal of the nanostructures in the preceding step to form oxidised nanostructures.

3. The method according to claim 2 wherein the metalorganic precursor of step c) i) is identical to the metalorganic precursor of deposition step b) i).

4. The method according to claim 1 wherein the metal of the metal oxide is chosen from indium, gallium, zinc, cadmium, aluminium, tin, antimony, bismuth, tellurium, and selenium.

5. The method according to claim 1 wherein the metalorganic precursor used in the nucleation step is trimethylindium or trimethylgallium.

6. The method according to claim 1 wherein the deposition step is a deposition of two metals using a mixture of two metalorganic precursors.

7. The method according to claim 1 wherein the metalorganic precursor used in the deposition step is trimethylindium or trimethylgallium.

8. The method according to claim 1 wherein the metalorganic precursor is the same during all of the steps of the method.

9. The method according to claim 1 wherein, in the nucleation step and/or in the growth step, the step of depositing metal using the metalorganic precursor has a duration of less than 30 seconds.

10. The method according to claim 1 wherein, in the nucleation step and/or in the growth step, a defined time of the oxidising step has a duration greater than a duration of the step of depositing the metal precursor.

11. The method according to claim 1 wherein, in the nucleation step and/or in the growth step, the oxidising step is carried out without injecting oxidant precursor into the reactor.

12. The method according to claim 1 wherein, in the nucleation step and/or in the growth step, the oxidising step is carried out at an identical temperature to a temperature of the nucleation step.

13. The method according to claim 1 wherein a quantity of metalorganic precursor injected into the reactor during the deposition step of the nucleation step is less than 50 µmol/min.

14. The method according to claim 1 wherein a quantity of metalorganic precursor injected into the reactor during the deposition step of the growth step is less than 50 µmol/min.

15. The method according to claim 1 comprising partially oxidising the nanostructures.

16. The method according to claim 1 wherein the top face of the substrate is a layer of an electrically conductive material.

17. The method according to claim 9, wherein the duration is less than 15 seconds.

18. The method according to claim 10, wherein the duration of the oxidising step is at least 45 seconds.

* * * * *